United States Patent
Bronner et al.

[11] Patent Number: 5,923,991
[45] Date of Patent: Jul. 13, 1999

[54] METHODS TO PREVENT DIVOT FORMATION IN SHALLOW TRENCH ISOLATION AREAS

[75] Inventors: Gary Bela Bronner, Stormville, N.Y.; Jeffrey Peter Gambino, Gaylordsville; Larry A. Nesbit, Farmington, both of Conn.

[73] Assignee: International Business Machines Corporation, Armonk, N.Y.

[21] Appl. No.: 08/740,907

[22] Filed: Nov. 5, 1996

[51] Int. Cl.$^6$ .................................................. H01L 21/76
[52] U.S. Cl. .......................... 438/424; 438/696; 438/697
[58] Field of Search ...................... 438/424, 427, 438/428, 435–438, 696, 697, FOR 227; 148/DIG. 85, DIG. 86, DIG. 50

[56] References Cited

U.S. PATENT DOCUMENTS

| | | |
|---|---|---|
| 4,755,479 | 7/1988 | Miura . |
| 4,942,137 | 7/1990 | Sivan et al. . |
| 5,118,382 | 6/1992 | Cronin et al. . |
| 5,229,316 | 7/1993 | Lee et al. . |
| 5,234,852 | 8/1993 | Liou . |
| 5,387,539 | 2/1995 | Yang et al. . |
| 5,447,884 | 9/1995 | Fahey et al. . |
| 5,459,096 | 10/1995 | Venkatesan et al. . |
| 5,472,904 | 12/1995 | Figura et al. . |
| 5,492,858 | 2/1996 | Bose et al. . |
| 5,494,857 | 2/1996 | Cooperman et al. . |
| 5,498,565 | 3/1996 | Gocho et al. . |
| 5,504,033 | 4/1996 | Bajor et al. . |
| 5,521,422 | 5/1996 | Mandelman et al. . |
| 5,733,383 | 3/1998 | Fazan et al. . |
| 5,736,451 | 4/1998 | Gayet . |

OTHER PUBLICATIONS

Pierre C. Fazan and Viju K. Mathews, A Highly Manufacturable Trench Isolation Process for Deep Submicron DRAMs, Dec., 1993.

*Primary Examiner*—George Fourson
*Attorney, Agent, or Firm*—Schmeiser, Olsen & Watts; Daryl K. Neff

[57] ABSTRACT

A number of methods to prevent divot formation, and the resulting enhanced electric field associated therewith, are disclosed. In a first embodiment of the present invention, spacers having a low etch rate in hydrofluoric acid solution, and that can be etched selectively to silicon dioxide are used to protect the silicon nitride liner from forming the divot. In a second embodiment of the present invention, a silicon dioxide spacer is used prior to the etching of the trenches, to allow the formation of the divots above the level of the silicon wafer, where they are not problematic. In a third embodiment of the present invention, a multi layer polish stop is used to prevent the formation of the divot.

6 Claims, 7 Drawing Sheets

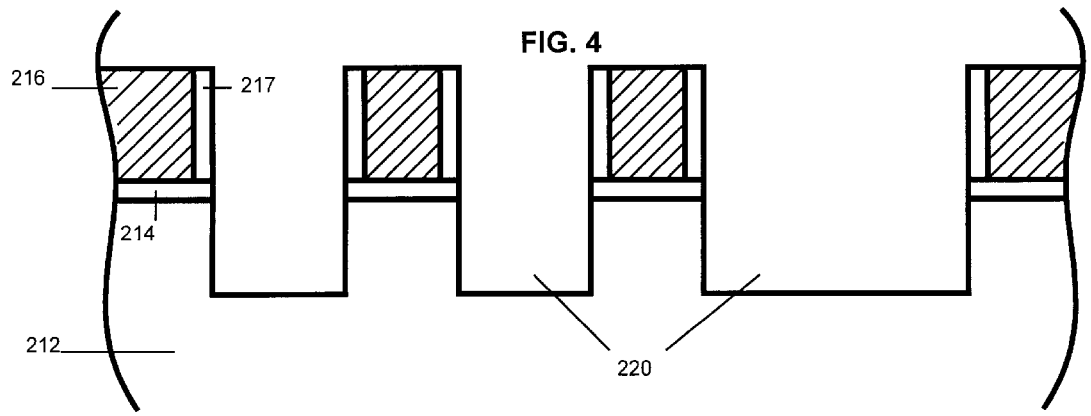

METHODS TO PREVENT DIVOT FORMATION IN SHALLOW TRENCH ISOLATION AREAS

BACKGROUND OF THE INVENTION

1. Technical Field

The present invention relates generally to a method of manufacturing integrated circuit (IC) chips and the IC chips formed by the implementation of the method. More specifically, the present invention relates to methods to prevent divot formation in shallow trench isolation areas.

2. Background Art

The trend in semiconductor device fabrication towards increasing density of circuit components requires that smaller areas of the circuit be devoted to isolation of the circuit components and capacitative storage devices. The need to reduce the surface area used for circuit components such as isolation structures and large area capacitor devices has resulted in the development of structures vertically oriented with respect to the plane of the substrate surface. These vertical structures typically consist of some type of trench structure sunk into the semiconductor substrate and are positioned between charge carrying components of adjacent transistors. The utilization of a trench structure enables the formation of a structure having large volume while minimizing the amount of surface area consumed.

However, the formation of vertically oriented isolation structures does not completely eliminate the possibility of current leakage paths. Accordingly, various isolation techniques have been developed and are used in advanced integrated circuitry to electrically isolate the various devices in the semiconductor substrate. One technique, shallow trench isolation, is often used in IC chips to provide higher device densities and better planarity than other isolation methods.

In this technique, the shallow trench isolation area is first defined to form isolation trenches surrounded by areas of wafer having a pad oxide layer and a polish-stop nitride layer on the surface. The isolation trench is then thermally oxidized to form a thin oxide layer on the isolation trench surfaces. A thin nitride liner is often deposited inside the isolation trench surfaces to prevent stress during the subsequent oxidation steps because the stress causes dislocations in the silicon wafer. The isolation trench is then filled with a chemical vapor deposited ("CVD") oxide and chemically mechanically polished ("CMP") back to the polish-stop nitride layer to form a planar surface. The polish-stop nitride layer is then removed. At this time, if there is a nitride liner, exposed areas of the nitride liner are etched back as well, creating a divot. If there is no nitride liner, a divot can still form in the $SiO_2$ surface adjacent to the Si due to stress at the Si—$SiO_2$ interface. The pad oxide is then removed by a wet etch, which may also cause the divot to grow. The gate oxide is then grown on the silicon wafer surface and the gate polysilicon ("gate poly") is deposited. When the gate poly is deposited, it will fill the divots, causing an enhanced electric field or corner device, which may affect the threshold voltage of the field effect transistor ("FET").

In order to solve this problem, methods have been suggested e.g., one by Fazan et al., IEDM, 1993, p. 57 in which an oxide spacer is formed after the polish stop nitride is removed. However, problems still occur when using the oxide spacer because there is no etch stop and it is possible to damage the underlying silicon wafer during the reactive ion etch ("RIE") process used to form the oxide spacer. Additionally, if the oxide spacer is too thin, it may be completely removed during the subsequent wet etches and divots may form.

Accordingly, a need exists for a method to reduce the likelihood of the formation of divots in order to reduce the number of chips that fail. Furthermore, the method should be relatively simple and performed using existing tools.

SUMMARY OF THE INVENTION

The present invention describes novel methods of preventing the formation of the divots, which in turn lead to chip failure due to the enhanced electric field or corner device where the gate overlaps the shallow trench isolation areas between devices. In the first embodiment of the invention, a spacer, similar to that suggested by Fazan et al., is used. However, the spacer is of a material that is etched selectively to silicon dioxide during the reactive ion etch process and has a low etch rate in hydrofluoric acid ("HF").

In a second embodiment of the invention, a spacer is formed prior to the trench etch. In this process, the silicon nitride polish stop is also used as a mask for the trench etch process. The silicon dioxide spacer may allow a divot to form at the top of the shallow trench isolation area during the removal of the nitride polish stop, however, it is well above the surface of the silicon substrate and, therefore, the divot depth is reduced.

In a third embodiment of the present invention, the polish stop is formed of multiple layers. After the pad oxide growth, thin layers of nitride and then oxide are deposited. A thick layer of silicon nitride is deposited on the surface of the oxide. The top two layers are removed by wet etches, during which the nitride shallow trench isolation area liner is protected by the bottom nitride layer. The bottom nitride layer is then removed by selectively, directionally RIEing to the oxide layer. Because the RIE is directional, the nitride liner is not attacked and a divot does not form.

Numerous other advantages and features of the present invention will become readily apparent from the following detailed description of the invention, the drawings and the appended claims.

BRIEF DESCRIPTION OF THE DRAWINGS

In the drawings:

FIGS. 4–8 are schematics, in cross-section, of a method in accordance with a second embodiment of the present invention;

DETAILED DESCRIPTION OF THE PREFERRED EMBODIMENTS

In the present invention, methods for reducing the number of divots that form during integrated circuit ("IC") chip fabrication are presented. Each of the methods utilizes a protecting spacer or level to protect the area of silicon nitride from being etched below the surface during the wet etch steps.

Figure 1:
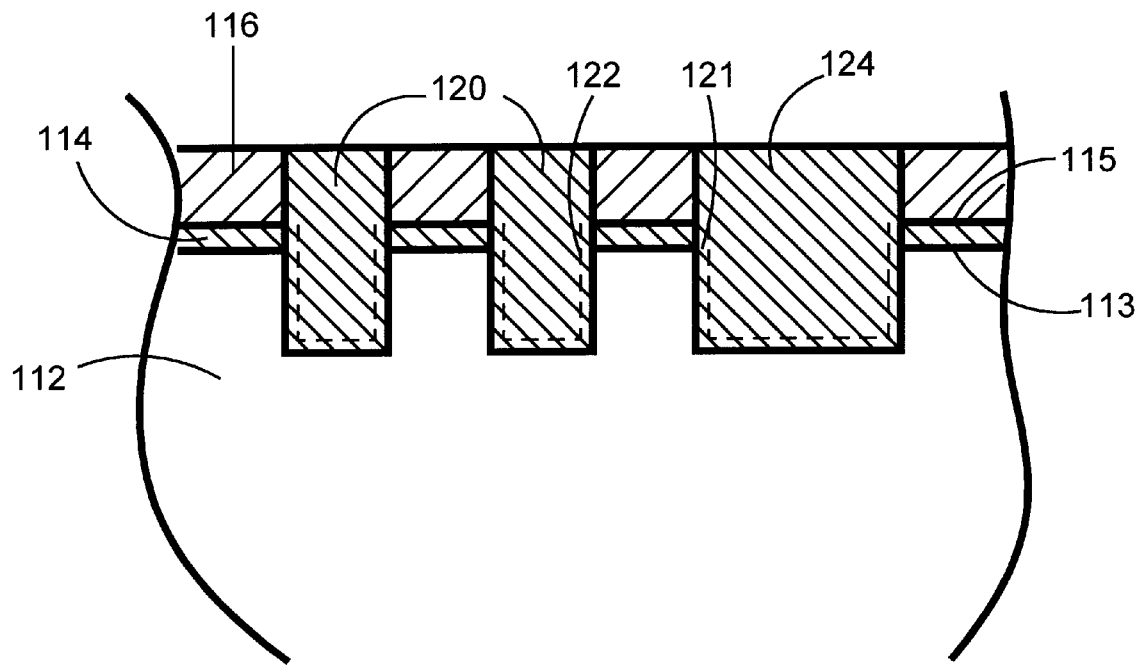
FIGS. 1–3 are schematics, in cross-section, of a method in accordance with a first embodiment of the present invention.
Figure 2:
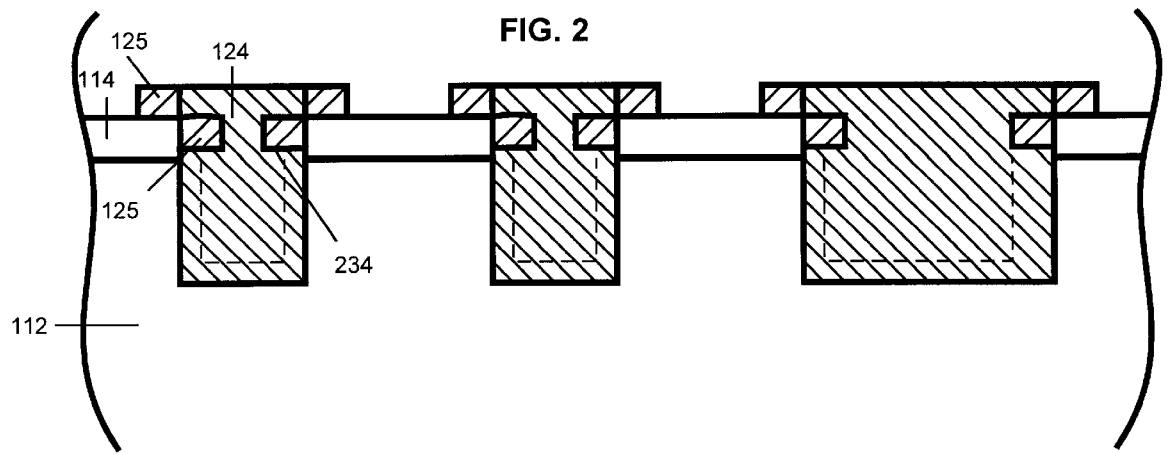
Figure 11:
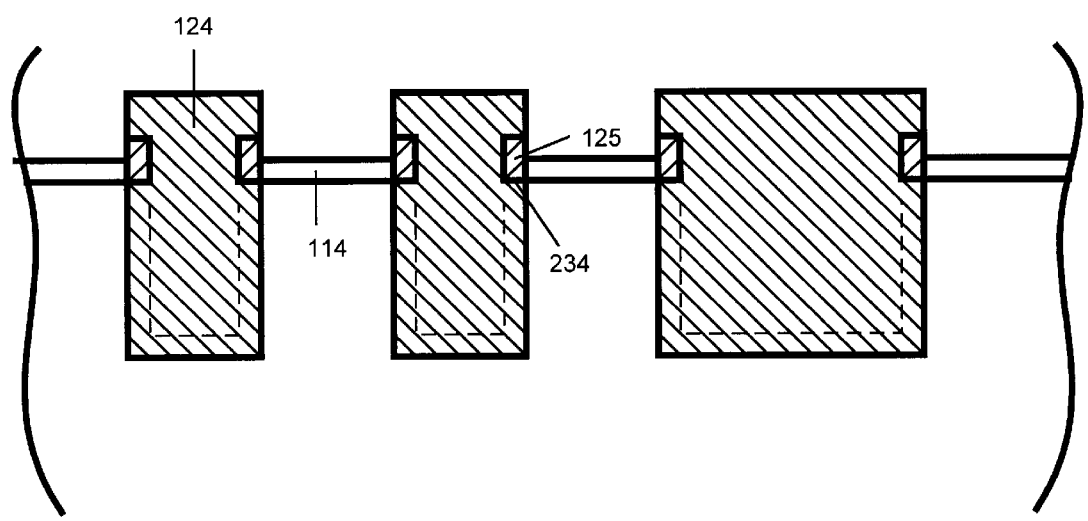
FIGS. 11 and 12 are schematics, in cross-section of a method in accordance with an alternative to the first embodiment of the present invention.

In a first embodiment of the present invention, a substrate including: a silicon wafer 112 having a pad oxide layer 114 on an upper surface 113; a relatively thick layer of silicon nitride 116 on an upper surface 115 of the pad oxide; and a number of trenches 120, each of which is lined with a thermal oxide 121, a liner of silicon nitride (indicated by the dashed lines 122) and then completely filled with a chemical vapor deposited silicon dioxide 124, is provided by methods commonly known in the art, as shown in FIG. 1. The silicon nitride layer is removed selectively to the oxide which forms divots 234. Next, a spacer material is deposited over the entire surface. The spacer material is chosen from the group consisting of materials that can be etched selectively to silicon dioxide during reactive ion etching and have low etch rates in hydrofluoric acid ("HF") solutions. Two examples are polysilicon ("polySi") and silicon nitride. The spacer material is then reactive ion etched ("RIEed") directionally to form spacers 125 adjacent the topographical areas, i.e., the edges of the silicon dioxide trench-filling material 124 that has not been planarized. By using these materials, the spacer 125 may be formed without damaging the silicon wafer, because the pad oxide remains as a polish stop. In addition, the spacers may be very thin, in the range of about 10 to about 50 nanometers ("nm"), because they will not etch in HF. The spacers may also be formed by an isotropic wet or dry etch. In this case the spacer material only remains in the area of divots 234 formed by the removal of the silicon nitride layer, as shown in FIG. 11.

Although the silicon nitride liner is still etched during the initial silicon nitride polish stop removal step, the spacers will protect the silicon dioxide next to the etched liner during the subsequent wet etches, which are performed to remove the pad oxide and planarize the surface.

Figure 3:
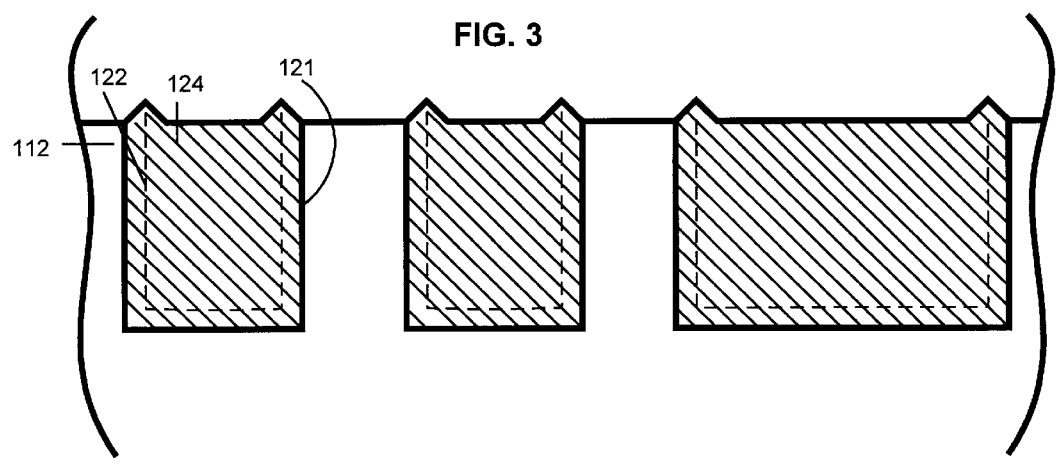
Figure 6:
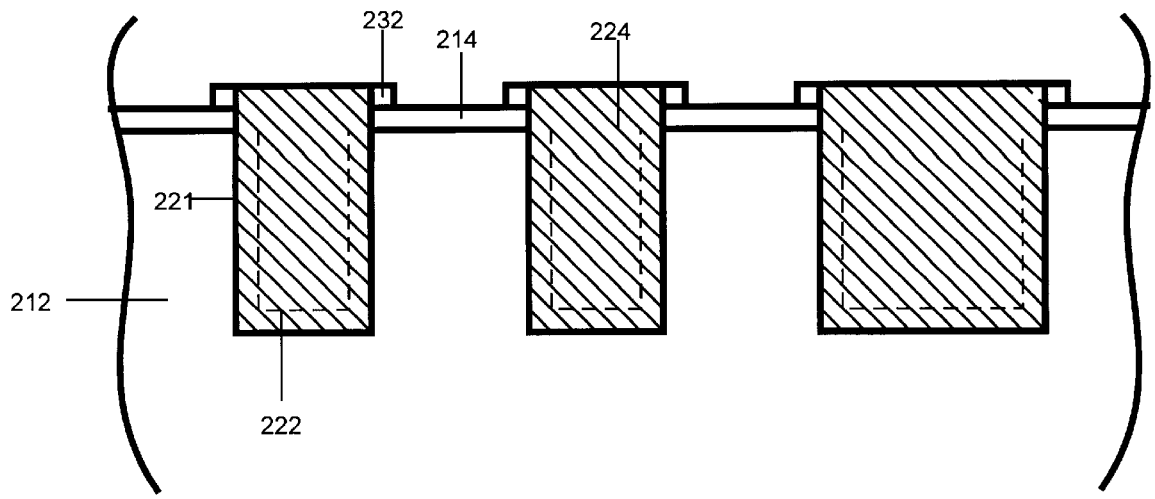
Figure 12:
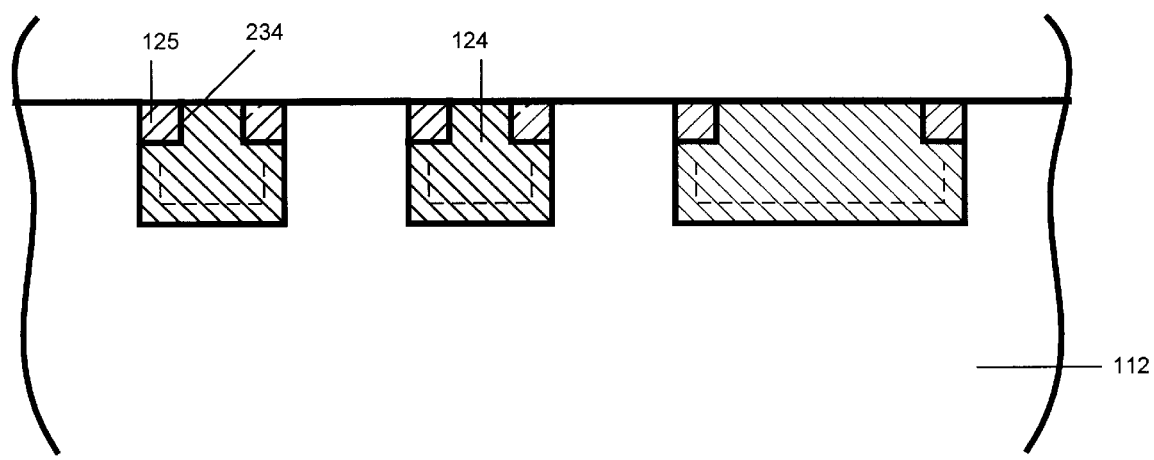

The spacers may be removed prior to the growth of the gate oxide on the silicon surface using either a selective wet or dry etch, in a solution such as phosphoric acid, to form the final product as shown in FIG. 3. Furthermore, if the spacer is polysi, the spacers may be converted to insulative $SiO_2$ by oxidation at a temperature preferably in the range of about 600° Celsius ("C") to about 1000° C. in wet or dry oxygen. In the case of silicon nitride or any otherwise suitable and dielectric material, the spacers 125 may be left in the structure to till the divots 234 as shown in FIG. 12, if the spacers are sufficiently small.

In a second embodiment of the present invention, a silicon dioxide spacer and the silicon nitride polish stop layer is used as a mask. A substrate is provided including a silicon wafer 212; a layer of a pad oxide 214; and a layer of silicon nitride 216. The layer of silicon nitride 216 is typically thick and is used as a polish stop layer. The silicon nitride polish stop is patterned first (using standard processes, well known in the art), being removed in regions where trenches are to be formed. This definition process causes portions of the pad oxide layer to be exposed and creates vertical sidewalls 217 of the silicon nitride. After stripping the resist, a layer of silicon dioxide (not shown), typically in the range of about 10 nm–50 nm is deposited over the surface of the exposed portions of the pad oxide 214 and the silicon nitride 216, including the vertical sidewalls 217. This layer of silicon dioxide is then etched by RIE to form sidewall spacers 232 adjacent the vertical sidewalls of the silicon nitride polish stop. The silicon wafer is then etched using the silicon dioxide spacer along with the silicon nitride polish stop as a mask to form trenches 220, as shown in FIG. 4.

Figure 7:
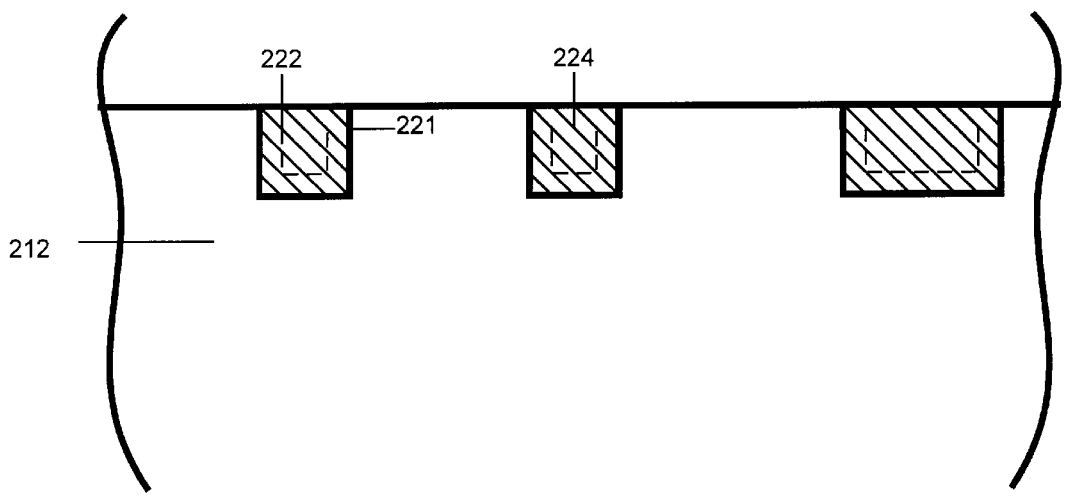
Figure 8:
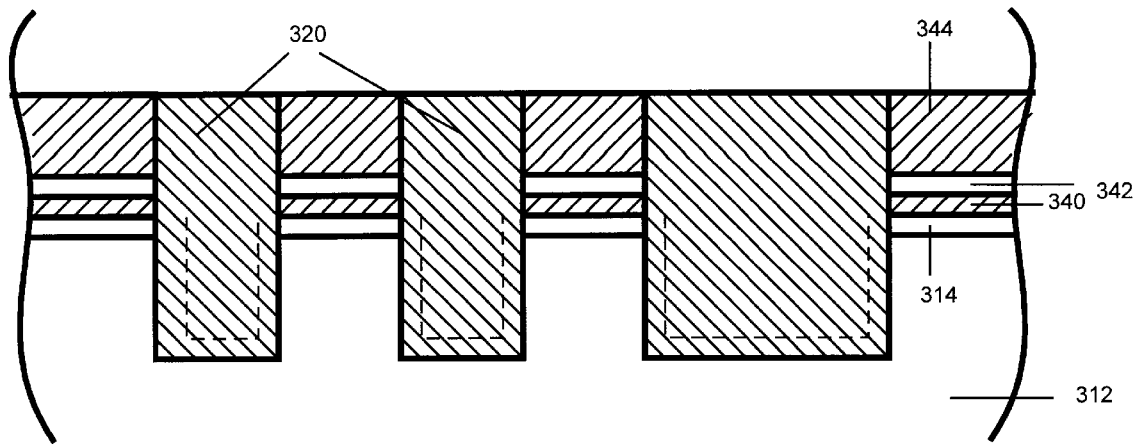

As shown in FIG. 5, the trenches are lined with a thermal oxide 221, a nitride liner (indicated by dashed lines 222), and then filled with CVD silicon dioxide 224 and patterned by polishing. The silicon nitride polish stop is then removed, which may cause a divot to form. However, this divot is well above the surface of the silicon wafer. During the subsequent HF etches, to remove the pad oxide and planarize the surface, the divot depth is reduced because both the inside edge and the outer edge are exposed to the etch, as shown in FIG. 7.

Figure 9:
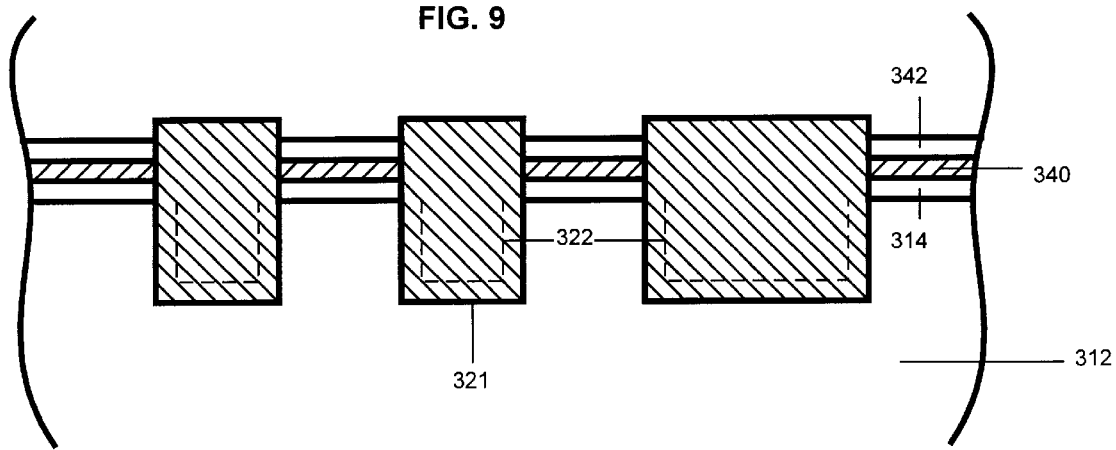
FIGS. 9–10 are schematics, in cross-section, of a method in accordance with a third embodiment of the present invention.
Figure 10:
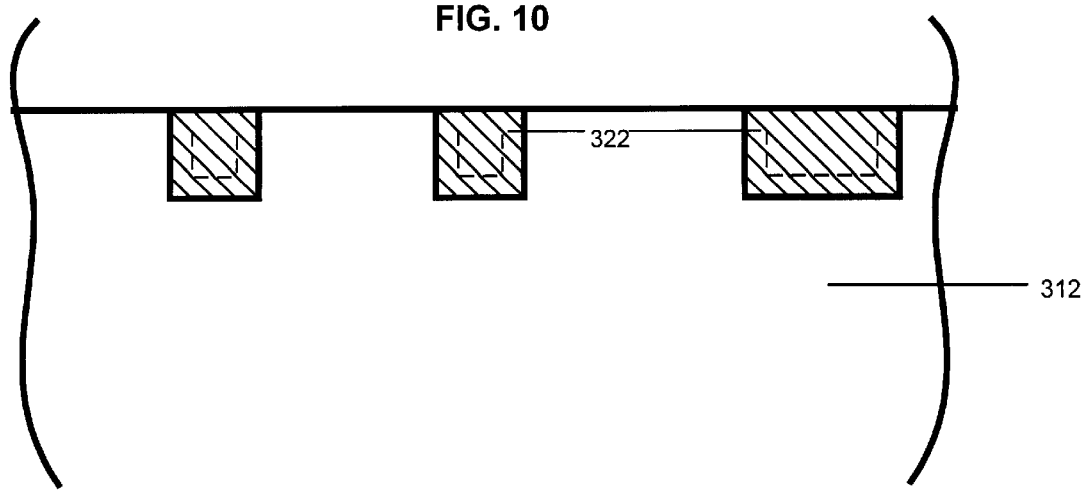

In a third embodiment of the present invention, a multi-layered polish stop is used to minimize the formation of divots. The pad oxide 314 is grown in the conventional manner, and a first layer of silicon nitride 340 is deposited on the surface. The first layer of silicon nitride is preferably a thin layer, in the range of about 10 nm to about 50 nm. A first silicon dioxide layer 342 is then deposited on the surface of the first silicon nitride layer. The thickness of the first silicon dioxide layer is preferably in the range of about 5 nm to about 20nm. A second silicon nitride layer 344 is then deposited, preferably to a thickness in the range of about 100 nm to about 200 nm. The trenches 320 are then etched and deposited using the standard processes, described above. The top two layers (the second nitride layer 344, resulting in the structure shown in FIG. 9, and then the first oxide layer 342) are removed by performing wet etches, commonly known in the art. The silicon nitride liner 322 is protected during these wet etches by the underlying, first silicon nitride layer 340. The first silicon nitride layer 340 is then removed selectively to the pad oxide 314 by a directional RIE and the pad oxide layer 314 is removed by a wet etch, as shown in FIG. 10. The silicon nitride liner is not attacked because the etch is directional. Hence, the divot does not form.

The foregoing specification is intended as illustrative and is not intended to be taken as limiting. Still other variations within the spirit and scope of this invention are possible and will readily present themselves to those skilled in the art.

Accordingly, what is claimed is:

1. A method for minimizing divot formation comprising the steps of:

providing a substrate having topographical areas of silicon dioxide to be planarized;

depositing a layer of a spacer material having a low etch rate in hydrofluoric acid solution and being selectively etchable to silicon dioxide; and etching the layer of spacer material to form spacers adjacent to the topographical areas using a wet isotropic etch.

2. The method of claim 1, wherein the spacer material is selected from the group consisting of: polysilicon and silicon nitride.

3. The method of claim 1, wherein the layer of the spacer material is deposited in the range of about 10 nanometers to about 50 nanometers in thickness.

4. The method of claim 1, further comprising the step of removing the spacers, wherein the spacers are removed by a wet etch.

5. The method of claim 1, further comprising the step of removing the spacers, wherein the spacers are removed by a dry etch.

6. The method of claim 2, wherein the spacer material is polysilicon, and wherein the spacers are converted to silicon dioxide by oxidation.

* * * * *

UNITED STATES PATENT AND TRADEMARK OFFICE
CERTIFICATE OF CORRECTION

PATENT NO. : 5,923,991

DATED : Jul. 13, 1999

INVENTOR(S) : Bronner et al.

It is certified that error appears in the above-identified patent and that said Letters Patent is hereby corrected as shown below:

Column 3, line 39, delete "till" and insert "fill".

Signed and Sealed this

Seventh Day of December, 1999

*Attest:*

Q. TODD DICKINSON

*Attesting Officer*     *Acting Commissioner of Patents and Trademarks*